United States Patent
Martin

(10) Patent No.: US 6,690,748 B2
(45) Date of Patent: Feb. 10, 2004

(54) RECEIVER WITH IMPROVED DIGITAL INTERMEDIATE TO BASE BAND DEMODULATOR

(75) Inventor: Frederick J. Martin, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 67 days.

(21) Appl. No.: 10/036,620

(22) Filed: Dec. 21, 2001

(65) Prior Publication Data

US 2003/0012307 A1 Jan. 16, 2003

Related U.S. Application Data

(60) Provisional application No. 60/303,538, filed on Jul. 6, 2001.

(51) Int. Cl.⁷ .............................. H04L 27/14; H03K 9/00
(52) U.S. Cl. ........................................ 375/324; 375/316
(58) Field of Search ................................ 375/324, 316, 375/350, 320; 341/143, 172, 168, 120, 139, 155

(56) References Cited

U.S. PATENT DOCUMENTS

| | | | |
|---|---|---|---|
| 5,754,601 A | * 5/1998 | Horng et al. | 375/350 |
| 5,995,036 A | * 11/1999 | Nise et al. | 341/172 |
| 6,160,859 A | * 12/2000 | Martin et al. | 375/345 |
| 6,304,202 B1 | * 10/2001 | Pastorello et al. | 341/155 |
| 6,356,594 B1 | * 3/2002 | Clement et al. | 375/261 |
| 6,449,569 B1 | * 9/2002 | Melanson | 702/65 |

* cited by examiner

Primary Examiner—Khai Tran
(74) Attorney, Agent, or Firm—Daniel K. Nichols

(57) ABSTRACT

A digital IF to base band demodulator (120) includes delta sigma samplers (202, 204) for sampling two channels of an IF signal at a sampling rate that is substantially higher than the Nyquist rate for the IF signal. A first pair of decimation filters (206, 208) decimates and filters the output of the delta sigma samplers (202, 204) but keeps the samples at a rate sufficient to perform digital mixing, cross adding, and pulse shape match filtering. A set of mixers (210, 212, 214, 216) mixers the output of the first pair of decimation filters with two phases of a digital representation of an local IF signal. A pair of summers (222, 224) sums, and subtracts outputs of the set of mixers (210, 212, 214, 216) in order to cancel undesired harmonics. A second set of decimation filters (226, 228) decimates and filters the output of the summers (222, 224) applying a filter function that is matched to a pulse shape of a base band signal present in the IF signal.

16 Claims, 7 Drawing Sheets

RECEIVER WITH IMPROVED DIGITAL INTERMEDIATE TO BASE BAND DEMODULATOR

CROSS REFERENCE TO RELATED APPLICATIONS

This application claims the benefit of U.S. Provisional Application No. 60/303,538 filed Jul. 6, 2001 and assigned to Motorola, Inc.

FIELD OF THE INVENTION

This invention pertains to communication signal receivers. More particularly this invention pertains to digital signal processing in receivers.

BACKGROUND OF THE INVENTION

In the next decade, communication enabled devices of various types are expected to proliferate. Among the communication enabled devices that are expected to proliferate are those employing small, low power, low cost transceivers. Such devices are expected to find use in asset tracking systems, wireless sensor networks, industrial and environmental monitoring, control systems, wireless personal computer peripherals, toys, and security systems among other things. In order to foster their proliferation, designs that lend themselves to reduced cost manufacturing are needed. Furthermore, devices that feature low power consumption and may be operated for long periods of time on small batteries or low power environmental energy sources (e.g., solar cells) are desired.

In recent years radio frequency (RF) receivers that are partly digital and offer low cost, low power consumption and high performance have been proposed. An important element in RF receivers employing digital circuitry is the analog to digital (A/D) converter. Because A/D converters sample signals at discrete points in time, and represent signals amplitudes by a limited number of discrete values, they create a type of noise termed quantization noise. This quantization noise can decrease the performance of a receiver, decreasing its ability to receive signals without error, or increasing the amount of power or spectrum required to transmit signals without error. Thus there is a need to reduce the quantization noise introduced in A/D converters of partially digital receivers. However this should be done without degrading the information carried in the received signals.

The A/D converter defines a partition between analog and RF portions of the receiver circuit and the digital portion of the circuit. A first approach to partitioning receivers is to mix a received signal to base band in the analog domain, then convert the base band signals to digital signals using base band delta-sigma A/D converters. This technique is widely used because of the high dynamic range of the base band delta-sigma converter. While this technique is widely used, it places difficult requirements for noise and linearity on analog circuits to perform the operation of converting the received signal to a base band signal. These requirements can typically be overcome though the use of expensive components and high power dissipation, both of which are undesirable.

A second approach makes use of a band pass delta-sigma converter as the A/D. In this approach, the received signal is converted to an intermediate frequency (IF) signal in the analog domain. The IF signal is then converted to the digital domain using the band pass delta-sigma sampler. Additional down conversion to base band is accomplished in the digital domain. While this approach addresses the noise and linearity issue of base band conversion approaches, the band pass delta-sigma converters tend to be high in power consumption and circuit area (an therefore cost) due to the need for band pass filters in their sampler circuit.

In communication systems that use phase shift key modulation (e.g., QPSK, OQPSK, QAM) each quantum of information (e.g., bit or chip) is represented in a base band signal by a pulse having a predetermined pulse shape (e.g., a one-half cycle Sine wave shaped pulse). In receivers of such systems in order to increase the receivers ability to detect such pulses (i.e., in order to attain high receiver sensitivity) it is desirable that the transfer function of the receiver be characterized by an impulse response function that has a functional form that matches the pulse shape of the quantum of information. In the frequency domain such an impulse function corresponds to a low pass filter with a corner frequency that corresponds to frequency limit of the base band signal.

What is needed is a receiver that includes a digital demodulator in which the effect of quantization noise on the receiver's sensitivity is controlled.

In particular, what is needed is a receiver that includes a digital demodulator in which the effect of quantization noise on the receiver's sensitivity is controlled.

What is needed is a digital demodulator that can perform the operations of mixing to base band, decimation and filtering while maintaining high receiver performance and minimizing circuit complexity and cost.

BRIEF DESCRIPTION OF THE FIGURES

The features of the invention believed to be novel are set forth in the claims. The invention itself, however, may be best understood by reference to the following detailed description of certain exemplary embodiments of the invention, taken in conjunction with the accompanying drawings in which:

DETAILED DESCRIPTION OF THE PREFERRED EMBODIMENT

Figure 1:
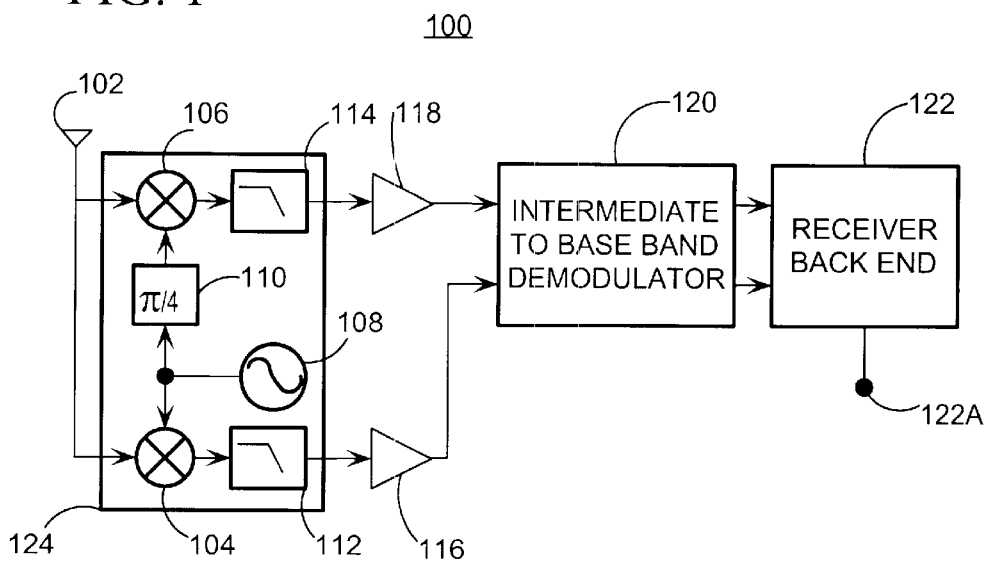
FIG. 1 is a block diagram of a receiver according to the preferred embodiment of the invention.

While this invention is susceptible of embodiment in many different forms, there are shown in the drawings and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. In the description below, like reference numbers are used to describe the same, similar, or corresponding parts in the several views of the drawings.

According to preferred embodiments of the present invention, a radio-frequency receiver is provided that includes a delta sigma sampler that outputs samples of a received intermediate frequency signal in which quantization noise introduced by the sampler is predominantly at frequencies above the intermediate frequency. The sampler output is coupled to a first decimation filter stage that reduces the amplitude of quantization noise and outputs samples of the intermediate frequency signal at a rate sufficient to digitally mix the intermediate frequency to base band, at a rate sufficient to cancel undesired harmonics in the mix signal by performing a cross add operation (requiring the rate to be higher than the preceding condition), and at a rate sufficient to perform pulse matched FIR filtering operation. The output of the first decimation filter is coupled to a digital mixer stage that mixes the IF signal to base band. The output of the mixer is, coupled to a second decimation filter stage that applies a finite impulse response filter that is preferably characterized by an impulse response that matches a pulse shape of the base band to the base band signal to derive information quantum from the base band signal. A cross add stage is preferably interposed between the output of the mixer and the second decimation filter stage in order to eliminate unwanted frequency sum components produced by the mixer.

FIG. 1 is a block diagram of a receiver 100 according to the preferred embodiment of the invention. As shown in FIG. 1, the receiver 100 comprises an antenna 102 coupled to a first RF to IF mixer 104, and coupled to a second RF to IF mixer 106. The antenna serves to couple a RF signal propagating in free space to the first 104 and second 106 RF to IF mixers. Although an antenna 102 is shown and is suitable for wireless communication through free space, the receiver 100 may be used for communication via other media, in which case the antenna 102 is replaced with a medium interfaces (e.g., waveguide coupler) suitable for other mediums.

A local oscillator 108 is coupled to the first RF to IF mixer 104, and is coupled to the second RF to IF mixer 106 through a π/4 phase shifter 110. The local oscillator 108 outputs a local oscillator signal at a frequency that is equal to the difference between the frequency of the RF signal and an IF signal frequency. The first 104, and second 106 mixers receive the RF signal and the local oscillator signal and mix them together so as to shift the received RF signal down to the IF signal frequency. The frequency of the local oscillator 108 is preferably chosen so as to obtain a relatively low IF. The IF is preferably less than four times the bandwidth of a base band signal that is included in the RF signal. More preferably, the IF is about equal to two times the bandwidth of the base band signal. The relatively low IF has advantages in further signal processing described below. Each of the two RF to IF mixers 104, 106 outputs one of two phases of the IF signal. The two phase of the IF signal are separated in phase by π/4 radians. The IF signal output by the first RF to IF mixer 104 is termed the in phase IF signal component, whereas the IF signal output by the second RF to IF mixer 106 is termed the quadrature phase IF signal component. The RF to IF mixers 104, 106 also output one or more undesired modulation products at frequencies above the RF signal frequency.

A first low pass filter 112 is coupled to the first RF to IF mixer 104, and similarly a second low pass filter 114 is coupled to the second RF to IF mixer 106. The first 112, and second 114 filters receive the quadrature and in phase IF signal components and the undesired modulation products and filter out the undesired modulation products.

The first RF to IF mixer 104, second RF to IF mixer 106, local oscillator 108, π/4 phase shifter 110, and first 112 and second 114 low pass filters are parts of an RF to IF demodulator 124.

A first low noise amplifier 116 is coupled to the first low pass filter 112 for receiving the in phase IF signal component, and similarly a second low noise amplifier 118 is coupled to the second low pass filter 114 for receiving the quadrature phase IF signal component. The first 116 and second 118 low noise amplifiers serve to amplify the in phase and quadrature phase IF signal components.

An intermediate to base band demodulator 120 is coupled to the first 116 and second 118 low noise amplifiers for receiving the in phase and quadrature phase IF signal components. The intermediate to base band demodulator 120 is described in more detail below with reference to FIG. 2. The intermediate to base band demodulator 120 extracts complex (i.e., I and Q channel) information quantum (e.g., chip or bit values) from the in phase and quadrature phase IF signals.

The intermediate to base band demodulator 120 is coupled to a receiver back end 122. The receiver back end 122 may include such functions as despreading multi chip bits (in the case of a DSSS signal), channel decoding, decryption (in the case of an encrypted signal), and source decoding. The receiver back end 122 comprises a receiver back end output 122A for outputting decoded information.

Figure 2:
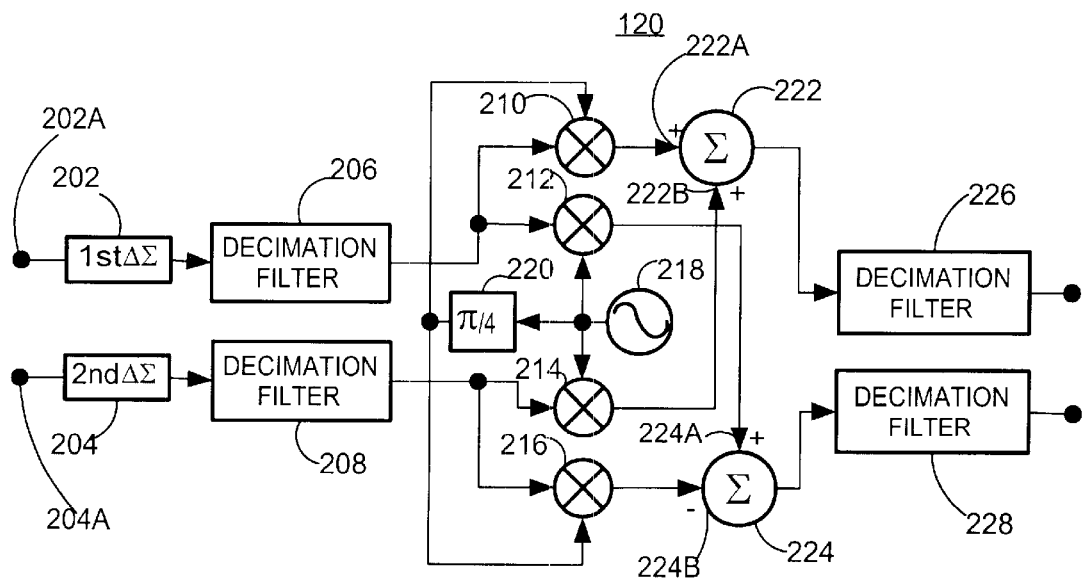
FIG. 2 is a block diagram of an IF to base band demodulator used in the receiver shown in FIG. 1 according to the preferred embodiment of the invention.

FIG. 2 is a block diagram of the RF to IF demodulator 120 used in the receiver shown in FIG. 1 according to the preferred embodiment of the invention. Referring to FIG. 2, a first delta sigma sampler 202 includes an input 202A coupled to the first low noise amplifier 116 (FIG. 1) for receiving the in phase IF signal component, and similarly a second delta sigma sampler 204 includes an input 204A coupled to the second low noise amplifier 118 (FIG. 1) for receiving the quadrature phase IF signal component. The first 202 and second 204 delta sigma samplers preferably sample the IF signals a frequency that is substantially higher than the Nyquist rate of the IF signal components. The delta sigma samplers 202, 204 output first and second series of samples respectively both of which are preferably characterized by a first sample rate and preferably include one bit per sample. The first 202, and second 204 delta sigma samplers add quantization noise to the IF signals that is characterized by a quantization noise spectrum that increases as a function of frequency, and has an advantageous low power density at the IF signal frequency.

The first delta sigma sampler 202 is coupled to a first decimation filter 206, and similarly the second delta sigma sampler 204 is coupled to a second decimation filter 208. The first decimation filter 206 filters and decimates the first series of samples and outputs a third series of samples that is characterized by a second sample rate that is substantially lower than the first sample rate but greater than the Nyquist rate of the in phase IF signal component, and preferably substantially larger than the Nyquist rate of the in phase IF signal component. Similarly, second decimation filter 208 filters and decimates the second series of samples, and outputs a fourth series of samples at the second sample rate. The first 206 and second 208 decimation filters preferably exhibit a low pass frequency response so as to block most of the quantization noise introduced by the first 202 and second 204 delta sigma samplers. By making the second sample rate substantially higher than the Nyquist rate, mixing to base band and elimination of the undesired frequency-sum term at the mixer output is facilitated. On the other hand, a benefit of making the second sample rate substantially lower than the first sample rate is that the computational cost and battery power required to perform subsequent processing is reduced. The IF signal frequency is preferably relatively low, i.e., preferably no more than about four times the base band signal bandwidth, allowing the second sample rate to be made relatively low. The second sample rate is preferably between about 10 and 30 times a Nyquist rate of the base band signals included in the IF signals. The decimation filters 206, 208 according to the preferred embodiment of the invention are described below in more detail with reference to FIGS. 6 and 7.

A first digital IF to base band mixer 210 and a second digital IF to base band mixer 212 are coupled to the first decimation filter 206 for receiving the third series of samples (i.e., samples of the in phase IF signal component). Similarly, a third digital IF to base band mixer 214, and a fourth digital IF to base band mixer 216 are coupled to the second decimation filter 208 for receiving the fourth series of samples (i.e., samples of the quadrature phase IF signal component). A digital local oscillator signal source 218 is coupled to the second 212 and third 214 digital IF to base band mixers. The digital local oscillator signal source 218 is coupled through a digital $\pi/4$ phase shifter 220 to the first 210 and fourth 216 digital IF to base band mixers. The functions of one or more of the four digital IF to base band mixers 210, 212, 214, 216, the digital local oscillator signal source 218, and the digital phase shifter 220 represent functionality that may be subsumed in a single circuit. A preferred design for a digital IF to base band mixer 800 is described below with reference to FIG. 8. FIG. 2 is a functional block diagram and should not be construed as limiting the circuit architecture used to implement what is shown and described.

In operation the first digital IF to base band mixer 210 multiplies successive subsets of the third series of samples by a first set of factors that represent, in discretized and quantized form, a first phase of a sinusoidal intermediate frequency local oscillator signal. The first digital IF to base band mixer 210 outputs resulting products in the form of a fifth series of samples. The second digital IF to base band mixer 212 multiplies successive subsets of the third series of samples by a second set of factors that represent, in discretized and quantized form, a second phase of the intermediate frequency local oscillator signal, and outputs resulting products in the form of a sixth series of samples. Likewise, the third digital IF to base band mixer 214 multiplies successive subsets of the fourth series of samples by the second set of factors, and outputs resulting products in the form of a seventh series of samples. Similarly, the fourth digital IF to base band mixer 216 multiplies successive subsets of the fourth series of samples by the first set of factors and outputs resulting products in the form of an eighth series of samples. The second set of factors is preferably a circularly shifted version of the first set of factors where the circular shift is equivalent to $\pi/4$ radians.

The first 210 and third 214 digital IF to base band mixers output a first phase of a base band signal plus an undesired sum term at about twice the IF. Similarly, the second 212 and fourth 216 digital IF to base band mixers output a second phase of the base band signal plus the undesired sum term at about twice the IF. The phases of the undesired sum terms produced by the IF to base band mixers 210, 212, 214, 216 vary.

A first summer 222 includes a first non-inverting input 222A coupled to the first digital IF to base band mixer 210, and a second non-inverting input 222B coupled to the third digital IF to base band mixer 214. The first summer 222 sums the output of the first 210 and third 214 digital IF to base band mixers, and by doing so reinforces the first phase of the base band signal, and cancels one or more undesired sum terms. Similarly, a second summer 224 includes a non-inverting input 224A coupled to the second digital IF to base band mixer 212, and an inverting input 224B coupled to the fourth digital IF to base band mixer 216. The second summer 224 subtracts the output of the fourth digital IF to base band mixer 216 from the output of the second digital IF to base band mixer 212 and by doing so reinforces the second phase of the base band signal and cancels one or more undesired sum terms. The first summer 222 produces its output in the form of a ninth series of samples that is the sample-by-sample sum of the fifth and seventh series of samples. Similarly the second summer 224 produces its output in the form of a tenth series of samples that is the sample-by-sample difference of the sixth and eighth series of samples.

A simplified exemplary set of signals are described below for the purpose of illustrating the operation of the digital IF to base band mixers 210, 212, 214, 216 and the first 222 and second summers 224.

If the in phase IF signal is represented as:

$$\frac{1}{2}\cos((\omega_s - \omega_l)t + \phi_i)$$

the quadrature phase IF signal is represented as:

$$\frac{1}{2}\sin((\omega_s - \omega_l)t + \phi_i)$$

the first phase of the digital oscillator signal is represented as:

$$\cos((\omega_s - \omega_l)t^r) \text{ and}$$

the second phase of the digital oscillator signal is represented as:

$$\sin((\omega_s - \omega_l)t^r)$$

where:
$\omega_s$ is the frequency of the received RF signal;
$\omega_l$ us the frequency of the local oscillator 108 (FIG. 1)
$\phi_I$ is a transmitted phase
Then the output of the first through fourth 210–216 digital IF to base band signals are as shown in the following table:

TABLE 1

| MIXER NUM. | OUTPUT |
|---|---|
| 1 | $\frac{1}{2}\frac{1}{2}\{SIN(2(\omega_s - \omega_l)t + \phi_i) + SIN(-\phi_i)\}$ |
| 2 | $\frac{1}{2}\frac{1}{2}\{COS(2(\omega_s - \omega_l)t + \phi_i) + COS(\phi_i)\}$ |
| 3 | $-\frac{1}{2}\frac{1}{2}\{SIN(2(\omega_s - \omega_l)t + \phi_i) + SIN(\phi_i)\}$ |
| 4 | $-\frac{1}{2}\frac{1}{2}\{-COS(2(\omega_s - \omega_l)t + \phi_i) + COS(\phi_i)\}$ |

Note that the signals are represented above as continuous sinusoidal signals for the purpose of illustration, despite the fact that they are transformed into discrete quantized series of samples by the first 202 and second 204 delta sigma samplers.

It may be observed from the Table 1 that by summing the output of the first 210 and third 214 digital IF to base band mixers one obtains $-\sin(\phi_I)$ which is the negative of a transmitted quadrature phase channel value of a transmitted information quantum (e.g., chip or bit). Furthermore it is seen that if the output of the fourth digital IF to base band mixer 216 is subtracted from the output of the second digital IF to base band mixer 212 then one obtains $\cos(\phi_I)$ which is a corresponding in phase channel value of the transmitted information quantum. The transmitted phase is modulated at a phase-modulated transmitter (not shown) in order to encode information. The phase modulation methods performed by phase shift key transmitters are known to persons of ordinary skill in the art, and lie outside the focus of the present invention. Alternatively the signals processed by the receiver 100 may be amplitude modulated, or both phase and amplitude modulated (e.q., using Quadrature Amplitude Modulation).

A third decimation filter 226 is coupled to the first summer 222. The third decimation filter receives ninth series of samples which is characterized by the second sample rate, from the first summer 222 low pass filters, and decimates the ninth series of samples, and outputs an eleventh series of samples at a third sample rate that is less than the second rate, and preferably about equal the Nyquist rate of the base band signal. Similarly, a fourth decimation filter 228 is coupled to the second summer 228 for receiving the tenth series of samples, which are also characterized by the second sample rate. The fourth decimation filter 228 filters and decimates the tenth series of samples, and outputs a twelfth series of samples, preferably at the third sample rate. The third 226 and fourth 228 decimation filters are preferably finite impulse response (FIR) filters that are characterized by an impulse response that matches a pulse shape that is used in the base band signal. The base band signal preferably comprises a series of pulses the polarization of which encodes real and imaginary information quantum (e.g., chips or bits) values. By matching the impulse response of the third 226 and fourth 228 decimation filters to the base band pulse shape, the ability of the receiver 100 to receive signal in the presence of noise and interference is improved.

According to preferred embodiments of the present invention the second rate is reduced considerably relative the first rate thereby lowering the number of operations per second (and consequently battery power) required to mix to base band and cross add. On the other hand the second rate is preferably higher than the Nyquist rate of the base band signal so that pulse matched FIR filtering may be applied. For pulse matched FIR filtering to be applied, the second sample rate should be at least about 5 times the Nyquist rate of the base band signals.

Figure 3:
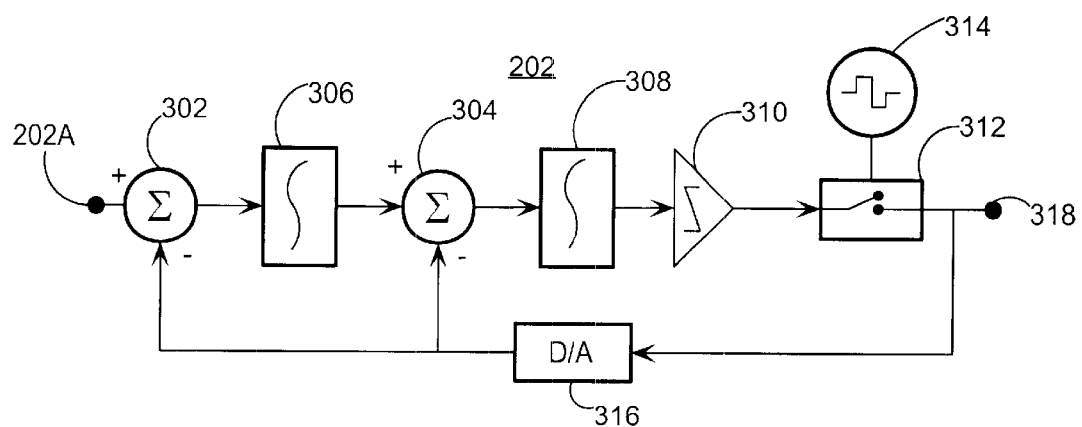
FIG. 3 is a block diagram of a delta sigma sampler that is used in the IF to base band demodulator shown in FIG. 2 according to the preferred embodiment of the invention.

FIG. 3 is a block diagram of the first delta sigma sampler 202 used in the IF to base band demodulator 120 shown in FIG. 2 according to the preferred embodiment of the invention. As shown in FIG. 3, the delta sigma sampler is a $2^{nd}$-order low-pass sigma delta sampler. Alternatively, a delta sigma sampler of higher order than two or first order sampler is used.

The second delta sigma sampler preferably has the same design as shown in FIG. 3. Referring to FIG. 3 the first delta sigma sampler 202 comprises a first summing junction 302 that includes a non-inverting input that serves as the first delta sigma sampler 202A input, an inverting input and an output. A first integrator (low pass filter) 306 is coupled to the output of the first summing junction 302. A non inverting input of a second summing junction 304 is coupled to the first integrator 306, for receiving a filtered output of the first summing junction 302. The second summing junction 304 further comprises an inverting input and an output. The output of the second summing junction 304 is coupled to a second integrator (low pass filter) 308. An input of a comparator 310 is coupled to the second integrator 308 for receiving a filtered output of the second summing junction 304. An output of the comparator 310 is coupled to a latch 312. The latch 312 is also coupled to a clock signal source 314. The clock signal source 314 supplies a clock signal that drives the operation of the latch 312 and determines the sampling frequency of the first delta sigma sampler 202. The latch 312 is preferably driven by the clock signal source 314 at a frequency that is substantially higher than the Nyquist rate of the IF signal. An output 318 of the latch 312 serves as an output of the first delta sigma sampler 202. The output 318 is coupled to an input of a digital to analog converter (D/A) 316. An output of the D/A 316 is coupled to the inverting inputs of the first 302 and second 304 summing junctions.

By setting the sampling frequency at a frequency substantially higher than the Nyquist rate of the IF signal, the quantization noise that is introduced into the IF signal by the sampling process is spread over a frequency band that is much wider than the IF. By feeding back the output of the delta sigma sampler 202, through the first 302 and second 304 summing junctions, the spectral power density of quantization noise power at the IF frequency is reduced.

Figure 4:
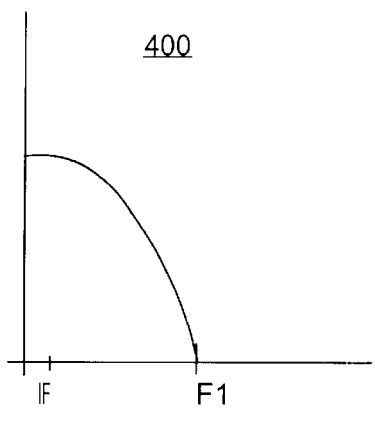
FIG. 4 is a graph of gain versus frequency for the delta sigma sampler shown in FIG. 3 according to the preferred embodiment of the invention.

FIG. 4 is a graph 400 of gain versus frequency for the delta sigma sampler shown in FIG. 3 according to the preferred embodiment of the invention. The graph 400 characterizes the transfer function between the delta sigma sampler input 202A and the delta sigma sampler output 318. As shown in the graph 400, the delta sigma sampler 202 exhibits a low pass frequency response. The graph reaches about zero at the first sampling rate which is marked on the abscissa as F1. The IF marked on the abscissa is preferably located well within (below the frequency of the 3 dB point) of the passband of the frequency response graph 400.

Although as shown, the graph 400 comprises a single lobe and is monotonically decreasing, in practice the filter function may be more complex depending on the frequency responses of the first 306 and second 308 integrators. The graph 400 in FIG. 4 represents the response of a sampler implemented using continuous time circuitry according to the preferred embodiment of the invention. It is also possible to implement the sampler by other means, including the use of switched capacitor circuitry. The continuous method is preferred because of its inherent attenuation at frequencies at or above the first sample rate as shown in the graph 400. By contrast, samplers implemented with switched capacitor circuitry would exhibit a non-zero response at the first sample rate.

Figure 5:
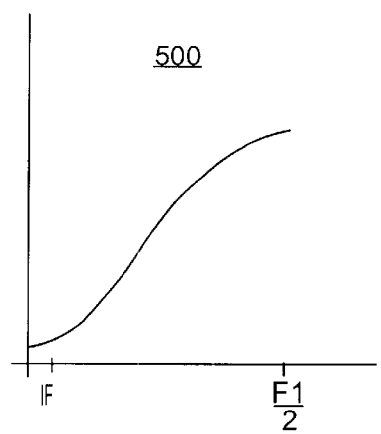
FIG. 5 is a graph of output quantization noise power versus frequency for the delta sigma sampler shown in FIG. 3 according to the preferred embodiment of the invention.

FIG. 5 is a graph of output quantization noise power versus frequency for the delta sigma sampler shown in FIG. 3 according to the preferred embodiment of the invention. As shown, the quantization noise power increases as a function of frequency, and has a relatively low value at the IF. Although in theory, the noise spectrum is not at its minimum at the IF, the inventors have discovered that in practice due to thermal noise, and clock jitter the noise at the IF is close to its minimum value. By choosing a relatively low IF it is possible to use delta sigma converters that uses relatively low cost, low complexity low pass filters 306, 308 as opposed to higher cost band bass filters. If, as is preferred, the IF is relatively low, the quantization noise spectrum will, in practice, be close to its minimum value at the IF.

As reflected in FIGS. 4 and 5, the delta sigma sampler effectively passes the IF signal while introducing a relatively low amount quantization noise into the IF signal.

Figure 6:
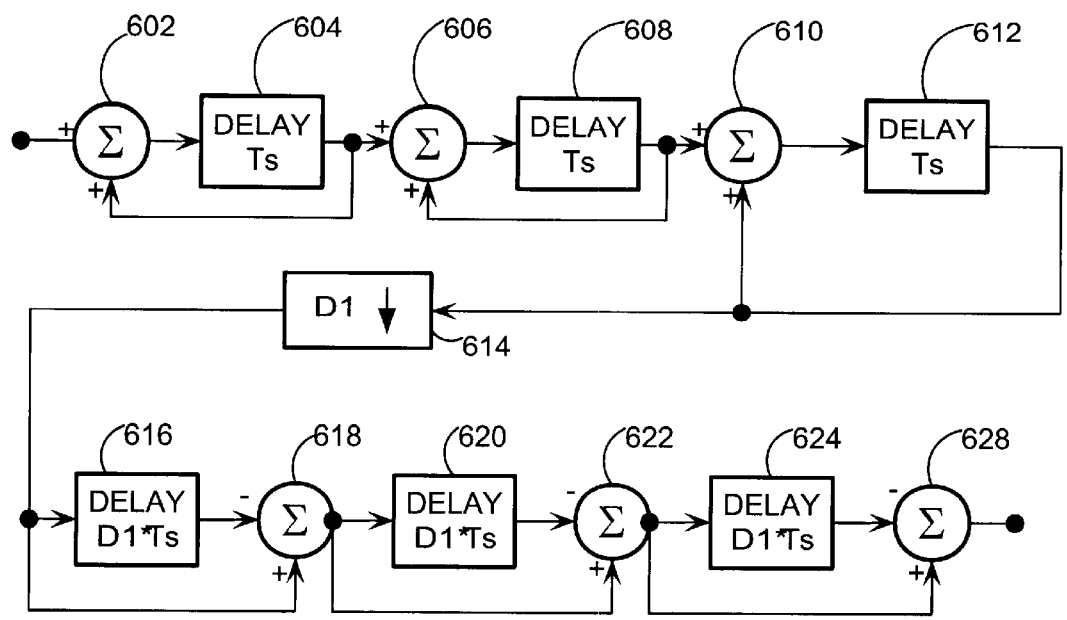
FIG. 6 is a block diagram of a decimation filter used in the IF to base band demodulator shown in FIG. 2 according to the preferred embodiment of the invention.

FIG. 6 is a block diagram of the first decimation filter 206 used in the IF to base band demodulator shown in FIG. 2 according to the preferred embodiment of the invention. The second decimation filter 208 (FIG. 2) preferably has the same design as shown in FIG. 6. Referring the FIG. 6, a first non-inverting input of a third summer 602 serves as an input of the first decimation filter 206. The third summer 602 further comprises a second non-inverting input and an output. The output of the third summer 602 is coupled to a first delay 604. The first delay 604 delays received samples by one sample period (at the first sample rate). The output of the first delay 604 is coupled to the second non inverting input of the third summer 602. The above described network of the third summer 602, and the first delay, may be regarded as a single stage of a first type. Three stages of the same topology are cascaded in series. The output of the delay in each stage is coupled to a non inverting input of a summer in the succeeding stage. The second stage comprises a fourth summer 606, and a second delay 608, and the third stage comprises a fifth summer 610, and a third delay 612. The number of stages determines the order of the first decimation filter 206. The significance of the order will be described below with reference to FIG. 7. The output of the third delay 612 is coupled through a first decimator 614 to a fourth delay 616. The first decimator 614 passes every D1th (where D1 is a first decimation factor) output of the third delay 612, and thereby changes the sample rate from the first sample rate to the second sample rate. The fourth delay 616 delays samples by one sample period at the second sample rate (the latter being equal to D1 times one sample period at the first sample rate). The fourth delay 616 is coupled to an inverting input of a sixth summer 618. A non-inverting input of the sixth summer 618 is also coupled to the decimator 614. The network of the fourth delay 616, and the sixth summer 618 may be regarded as a single stage of a second type. An output of the summer of each stage is coupled to a delay and to a non inverting input of a summer in a succeeding stage. Two more stages having the topology of the second type stage are cascaded in series following sixth summer 618. A fifth stage comprises a fifth delay 620 and a seventh summer 622. A sixth stage comprises a sixth delay 624 and an eighth summer 628. The number of stages of the second type is preferably equal to the number of stages of the first type. An output of the eighth summer 628 serves as an output of the first decimation filter 206.

The first decimation filter 206 preferably receives single bit samples and outputs multi bit samples. Thus, while the decimation filter 206 decimates the sample rate, the precision of each sample is increased.

Figure 7:
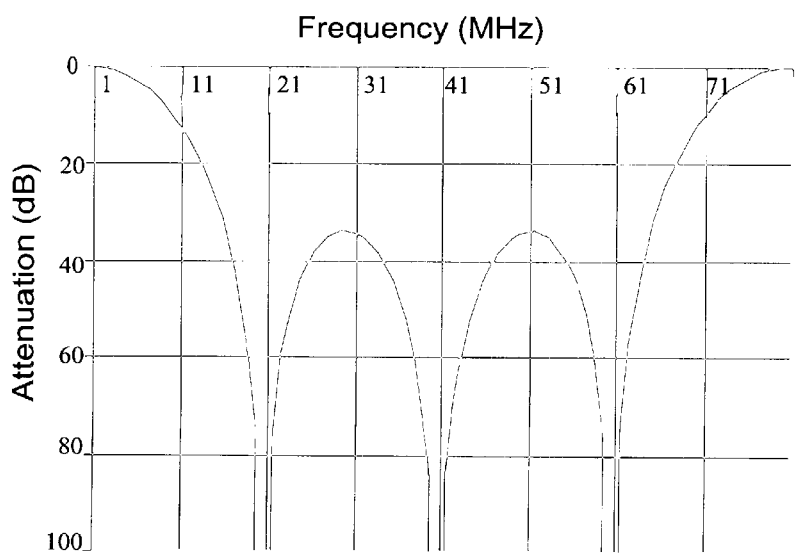
FIG. 7 is a calculated graph of attenuation versus frequency for the decimation filter shown in FIG. 6 according to the preferred embodiment of the invention.

FIG. 7 shows a calculated graph 700 of attenuation versus frequency for the first decimation filter as shown in FIG. 6 according to the preferred embodiment of the invention. In the graph 700 the abscissa gives the frequency in units of MHz, and the ordinate give the attenuation in units of decibels. The graph was calculated for an input sample rate of 80 Mhz, a first decimation factor D1 of 4, and for a third order decimation filter. 80 Mhz is the Nyquist rate for a frequency of 40 MHz, however due to the decimation by a factor of four, all frequencies above 10 Mhz will, in practice, be aliased into the 0 to 10 Mhz frequency range. The frequency response shown in the graph 700 is proportional to a Sinc function of frequency raised to the order of the first decimation filter, e.g., three for the design shown in FIG. 6.

Figure 8:
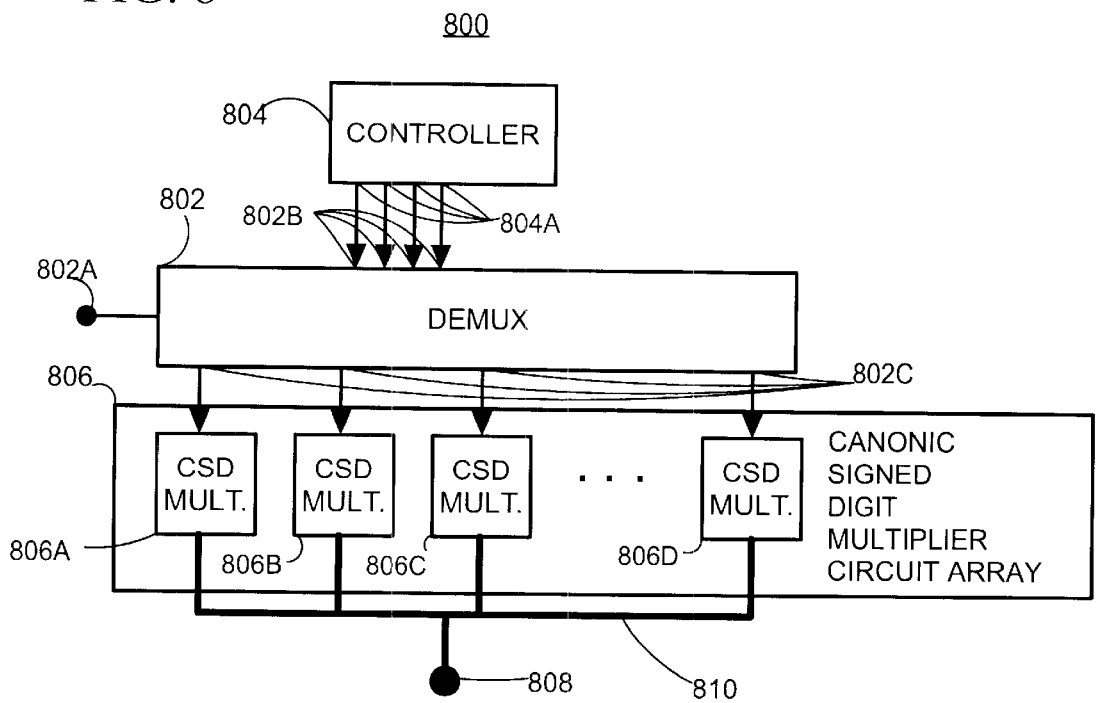
FIG. 8 is a block diagram of a digital IF to base band mixer that is used in the IF to base band demodulator shown in FIG. 2 according to the preferred embodiment of the invention.

FIG. 8 is a block diagram of a digital IF to base band mixer 800 that is used in the IF to base band demodulator shown in FIG. 2 according to the preferred embodiment of the invention. A representation of an intermediate frequency local oscillator signal is hardwired into the digital to base band mixer shown in FIG. 8, so that the function of digital local oscillator source 218 shown in FIG. 2 is subsumed in the mixer shown in FIG. 8. An input 802A of a demultiplexer 802 serves as the input of the mixer 800. A controller 804 includes one or more selection signal outputs 804A coupled to one or more output select control terminals 802B of the demultiplexer 802. In response to signals received on the output select control terminals 802B, the demultiplexer 802 couples the demultiplexer input 802A to one of a plurality of demultiplexer outputs 802C. The input 802A, and each of a plurality of demultiplexer outputs 802C is plural bits wide. The demultiplexer 802 may be implemented as a plurality of single bit demultiplexers that are configured for operation in unison. Each of the plurality of demultiplexer outputs 802C is coupled one of a plurality of canonic signed digit (CSD) multipliers 806A, 806B, 806C, 806D, of a canonic signed digit multiplier circuit array 806. Only four CSD multipliers 806A, 806B, 806C, 806D are shown for the purpose of illustration, however more may be used to more accurately represent the local oscillator signal. Outputs of the CSD multipliers 806A, 806B, 806C, 806D are coupled through a bus 810 to a common output 808. Alternatively, a multiplexer (not shown) that is controlled in coordination with the demultiplexer 802 may be provide for selecting one of the CSD multipliers 806A, 806B, 806C, 806D at a time. Each of the canonic signed digit multipliers 806A, 806B, 806C, 806D multiplies input samples by a factor that represents a quantized version of a local oscillator signal at a particular phase. The controller 804 periodically selects the outputs 802C of the demultiplexer 802. The outputs 802C are selected in order according to the phase represented by the CSD multipliers to which they are coupled. The rate at which the outputs 802C are selected is preferably equal to the second sample rate, so that each successive sample received at the input 802C is multiplied by a different CSD multiplier 806A, 806B, 806C, 806D of the array 806. The factors associated with the sequence of CSD multipliers selected during each IF signal period track a cycle of the local IF signal. Therefore, the IF signal represented in quantized and discretized form in a series of samples received at the demultiplexer input 802A is effectively multiplied by a set of function values that represent the local IF oscillator signal.

The CSD multipliers may be shared by two demultiplexers that are used to mix two series of samples with the digital representation of two phases of the local IF oscillator signal. In such an implementation due to the phase difference there would be no need for both demultiplexers to access a given CSD multiplier simultaneously.

The controller may comprise a counter that is clocked at the second rate. The CSD multipliers 806A, 806B, 806C, 806D may be used more than once during each cycle, in which case, a count direction of the counter, if a counter is used in the controller, may be reversed one or more times during each IF signal period. Optionally the output 808 may be selectively negated and each CSD multiplier may be used to represent two pairs of opposite phases of the local oscillator IF signal.

Figure 9:
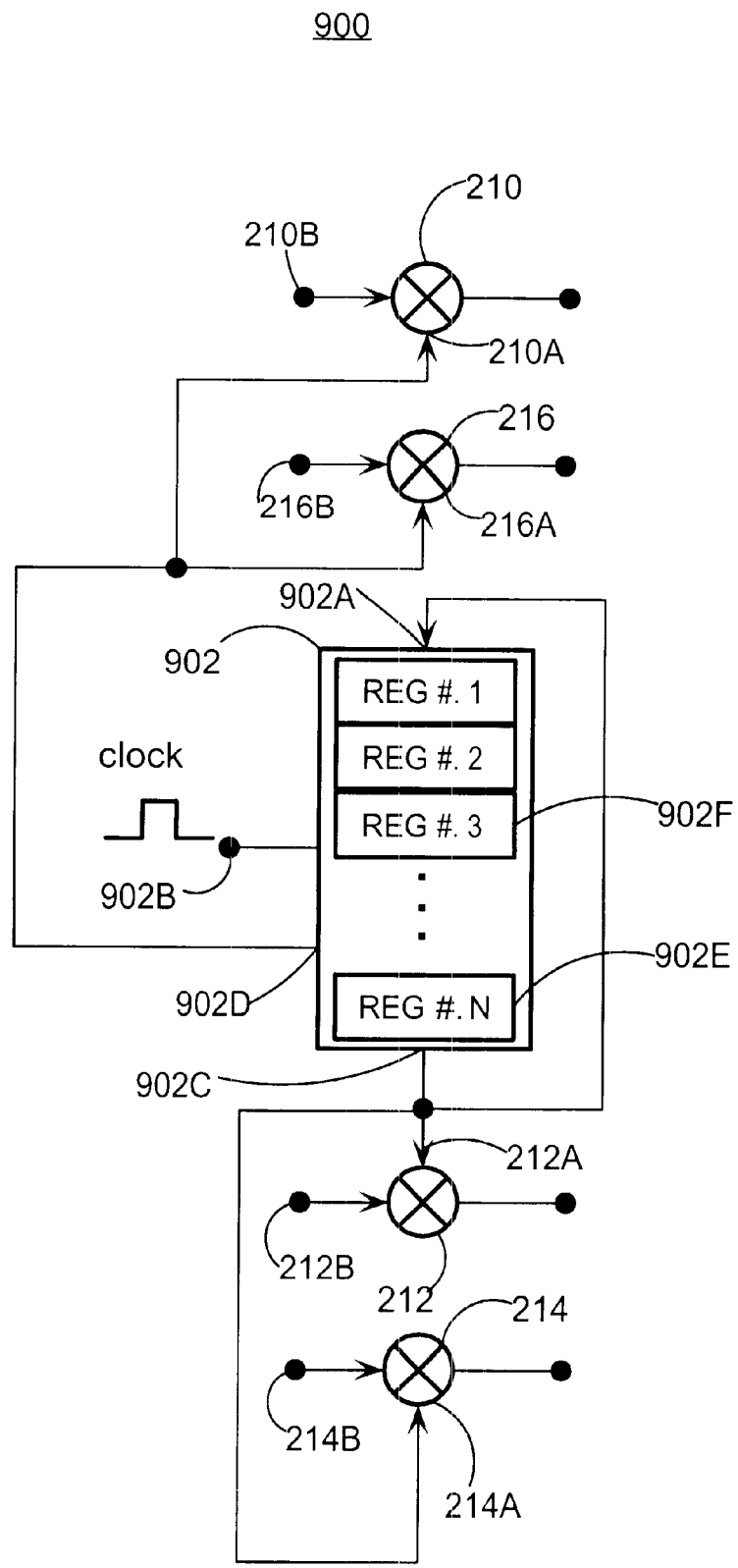
FIG. 9 is a block diagram of a digital local oscillator signal source, and four IF to base band mixers that are used in the IF to base band demodulator shown in FIG. 2 according to an alternative embodiment of the invention.

FIG. 9 is a block diagram of a digital local oscillator signal source, and the four IF to base band mixers 210, 212, 214, 216 that are used in the IF to base band demodulator shown in FIG. 2 according to an alternative embodiment of the invention. Referring to FIG. 9, a digital local oscillator signal source comprises a first shift register 902 that has a first output 902C coupled to an input 902A so as to form a circular shift register. The first shift register 902 stores a plurality of multi bit words in a plurality of internal registers. Each multi bit word in the first shift register 902 is a factor that is a quantized value that represents a local oscillator signal at a discrete phase. The multi bit words are initially stored in order according to the phases they represent, and the phase difference between successive multi bit words is preferably constant. Preferably, an entire period of the local oscillator signal is represented by the multi bit words stored in the first shift register 902. The first shift register 902 is preferably clocked at the second sample rate by a clock signal that is applied to a clock signal input 902B of the first shift register.

The number of internal registers, indicated as N in FIG. 9 is preferably between about 4 and 32.

A first output 902C of the first shift register 902 is coupled to a first internal register 902E for outputting each successive multi bit word that reaches the first internal register 902E. The first output 902C is coupled to a first input 212A of the second digital IF to base band mixer 212, and to a first input 214A of the third digital IF to base band mixer.

A second output 902D of the first shift register 902 is coupled to a second internal register 902F for outputting each successive multi bit word that reaches the second internal register 902F. The second internal register 902F, is preferably separated from the first internal register 902E by a number of internal registers positions, that in view of the multi bit words stored in the internal registers, is equivalent to a phase separation of π/4 radians. Accordingly the second output 902D serves as an in-phase digital local oscillator signal source, and the first output 902C serves as a quadrature phase digital local oscillator signal source. Note that the function of the π/4 phase shifter 220 shown in FIG. 2 is served by providing two outputs 902C, 902D that have a phase equivalent separation of π/4 radians. A separate component to achieve the function represented by the π/4 phase shifter 220 block in FIG. 2 is therefore not required for the embodiment shown in FIG. 9. The second output 902D is coupled to a first input 210A of the first digital IF to base band mixer 210 and is coupled to a first input 216A of the fourth digital IF to base band mixer 216.

The third series of samples is input at a second input 210B of the first digital IF to base band mixer 210, and at a second input 212B of the second digital IF to base band mixer 212. Similarly, the fourth series of samples is input at a second input 214B of the third digital IF to base band mixer 214, and at a second input 216B of the fourth digital IF to base band mixer 216. As described above the digital IF to base band mixers 210, 212, 214, 216 serve to multiply successive subsets of the third and fourth series of samples by first and second sets of factors. According to the embodiment shown in FIG. 9 the sets of factors are derived from two outputs of the multi bit word first shift register 902 which is configured as a circular shift register.

Figure 10:
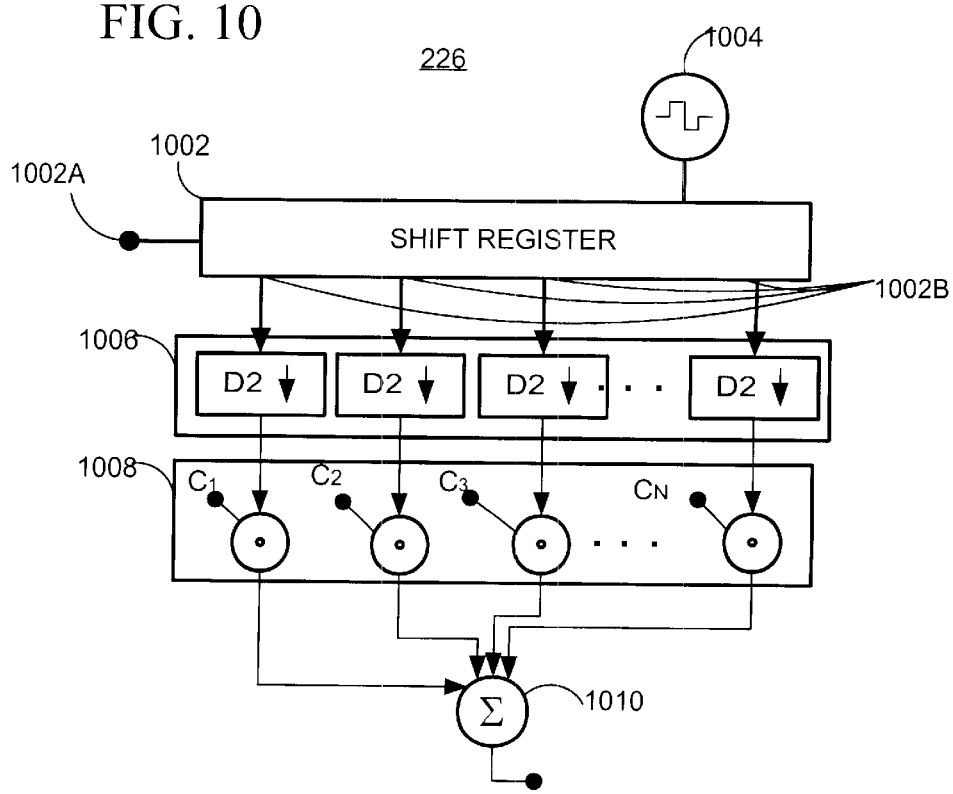
FIG. 10 is a block diagram of a decimation filter used in the IF to base band demodulator shown in FIG. 2 according to the preferred embodiment of the invention.

FIG. 10 is a block diagram of the third decimation filter 226 used in the IF to base band demodulator shown in FIG. 2 according to the preferred embodiment of the invention. The fourth decimation filter 228 (FIG. 2) preferably has the same design as shown in FIG. 10. According to the preferred embodiment the third 226 and fourth 228 decimation filters include an FIR filter that employs CSD multiplication. As shown in FIG. 10, the third decimation filter 226 comprises a second shift register 1002. The second shift register 1002 comprises an input 1002A for receiving the ninth series of samples, and a plurality outputs 1002B coupled to a succession of internal registers (not shown) that are part of the shift register 1002. Each of the plurality of outputs 1002B is coupled to a decimator in an array of decimators 1006. The decimators in the array of decimators 1006 are in turn coupled to inputs of CSD multipliers in an array of CSD multipliers 1008. Outputs of the CSD multipliers in the array of CSD multipliers 1008 are coupled to a multi input summer 1010.

Each of the decimators in the array of decimators 1006 preferably decimates by a second decimation D2 factor that is preferably equal to about the second sample rate divided by the Nyquist rate of the base band signals. The length of the second shift register 1002 is preferably equal to an integer multiple of the second decimation factor more preferably the length of the second shift register 1002 is equal to the second decimation factor D2. In the latter case, the CSD multipliers in the array of CSD multipliers 1008 preferably multiply successive subsets of the ninth series of samples by a set of factors that approximate the pulse shape of pulses included in the base band signal. The latter provision enhances the ability of the receiver 100 to detect signals in the presence of noise and interference. The use of CSD multipliers offers the advantage that the power required to operate the third decimation filter 226 is reduced.

Preferred embodiments of the invention have been described above with reference to block diagrams shown in the FIGS. The present invention may be implemented in whole or in part as one or more Application Specific Integrated Circuits (ASIC) which have an internal architecture that corresponds to the block diagrams shown in the FIGS. and described above. Alternatively, the invention may be implemented, in whole or in part, as a program that is executed by a programmable digital signal processor.

Figure 11:
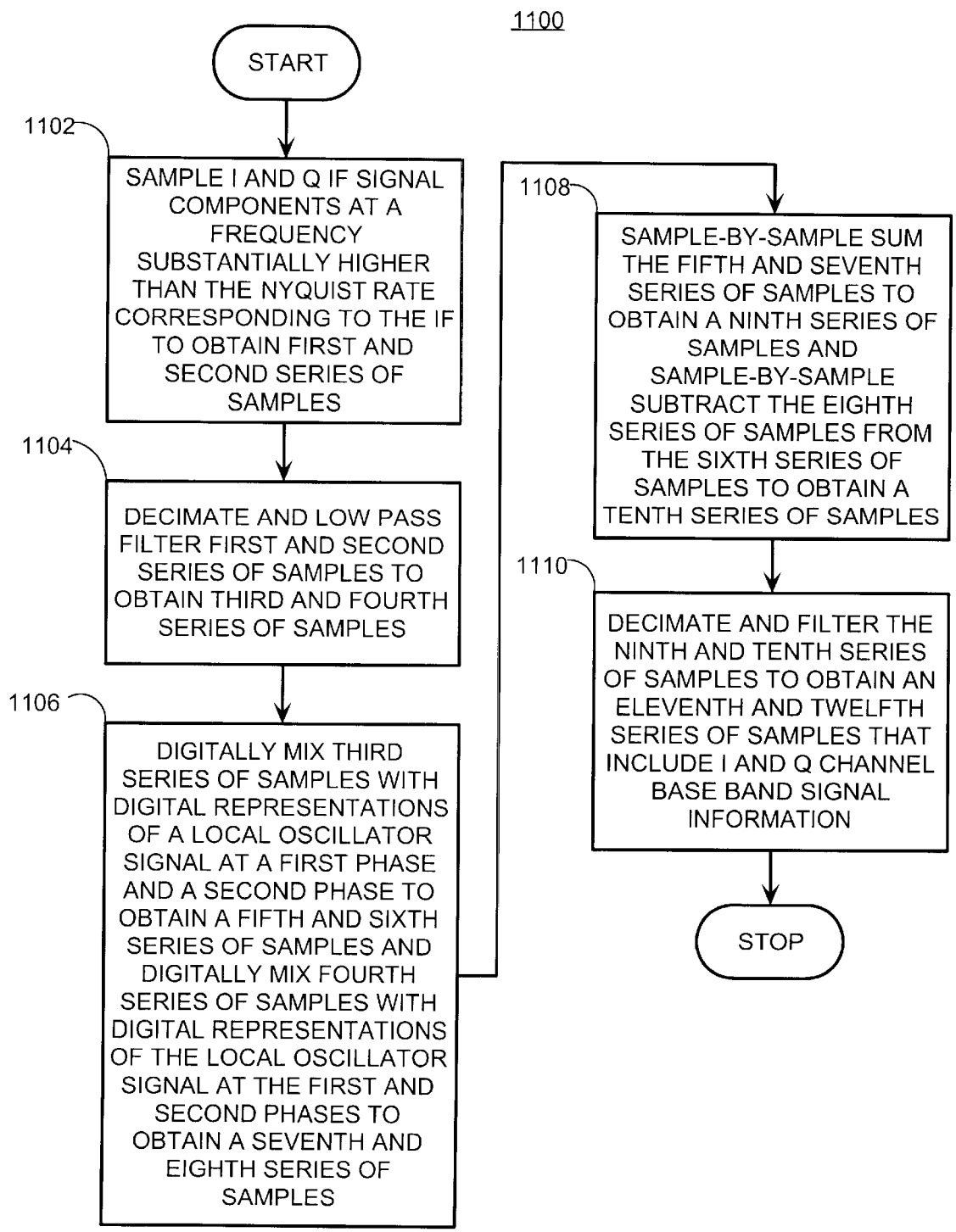
FIG. 11 is a flow diagram of a process for converting an IF signal to a digital base band signal according to the preferred embodiment of the invention.

FIG. 11 is a flow diagram of a process 1100 for converting an IF signal to a digital base band signal according to the preferred embodiment of the invention. Each block of the flow diagram includes two or more process that are preferably executed in parallel. In block 1102 in-phase and quadrature phase IF signal components are sampled at frequency that is substantially higher than the Nyquist rate corresponding to the IF in order to obtain the first and second series of samples. In block 1104 the first and second series of samples are decimated and low pass filtered to obtain the third and fourth series of samples. In block 1106 the third series of samples is digitally mixed with a first and a second phase of a digital representation of a local oscillator signal to obtain the fifth and sixth series of samples, and the fourth series of samples is digitally mixed with the first and the second phases of the digital representation of the local oscillator signal to obtain the seventh and eighth series of samples. In block 1108 the fifth and seventh series of samples are summed, sample-by-sample to obtain a ninth series of samples, and the eighth series of samples is sample-by-sample subtracted from the sixth series of samples to obtain the tenth series of samples. In block 1110 the ninth and tenth series of samples are filtered and decimated to obtain an eleventh and twelfth series of samples. The eleventh and twelfth series of samples contain I and Q channel base band signal information, and are characterized by the third sample rate.

The process shown in FIG. 11 is preferably performed by the hardware described above with reference to FIGS. 1–10. Alternatively, the process shown in FIG. 11 may be performed by processor executing a program that embodies the steps shown in FIG. 11.

Figure 12:
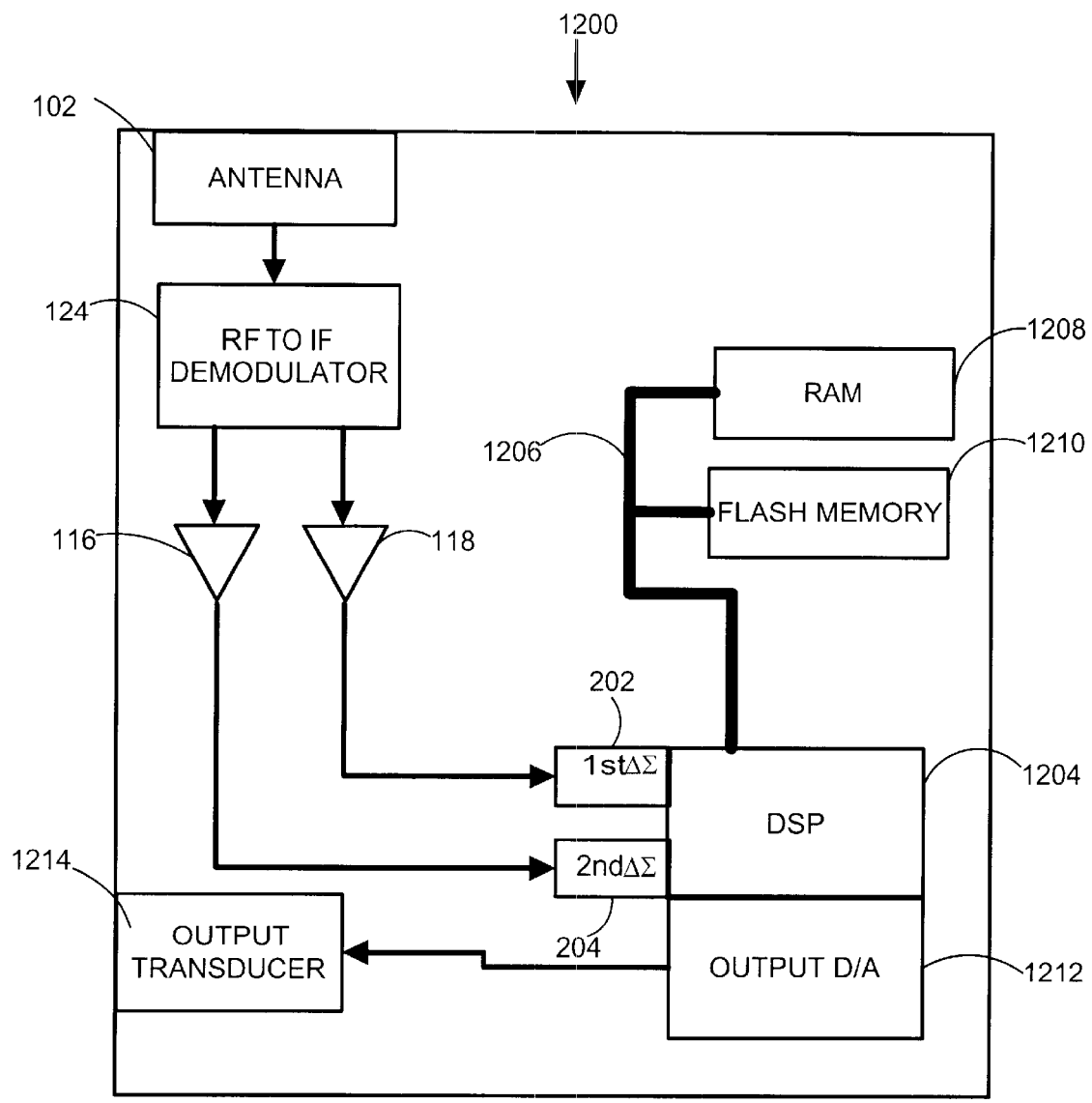
FIG. 12 is a hardware block diagram of a receiver according to an alternative embodiment of the invention.

FIG. 12 is a hardware block diagram of a receiver 1200 according to an alternative embodiment of the invention. As shown in FIG. 12, the antenna 102 is coupled to the RF to IF demodulator 124. The RF to IF demodulator 124 comprises two outputs that are coupled to the first 116 and second 118 low noise amplifiers. The first 116 and second 118 low noise amplifiers are in turn coupled to the first 202 and second 204 delta sigma samplers respectively. In this alternative embodiment, the delta sigma samplers 202, 204 serve as inputs of an a programmable digital signal processor 1204. The digital signal processor 1204 is coupled through a digital signal bus 1206 to a flash memory 1210 and to a random access memory 1208. The flash memory 1210 is a form of computer readable medium that is used to store a program that embodies the process shown in the flow chart of FIG. 11. The random access memory 1208 is used as a work space for executing the program stored in the flash memory 1210. The flash memory 1210 may also be used to store other programs including programs used in the receiver 1200 to perform despreading, channel decoding, decryption, and source decoding. The digital signal processor 1204 includes an output D/A 1212 that is coupled to an output transducer 1214. The output transducer 1214 may for example take the form of a video display or a speaker. A speaker may be useful in the case that the receiver 1200 is part of a voice communication system. More than one output transducer may be provided. The output transducer 1214 may be eliminated. If the receiver is part of a transponder the output transducer may not be needed.

The computer readable medium used in connection with the present invention as a memory for storing programs may comprise volatile memory such as RAM, or a medium that contains data in a transient state, such as a communication channel, network circuits, or a wireless communication link, or preferably nonvolatile memory including but not limited to, flash memory, Read Only Memory (ROM), EPROM, EEPROM, disk drive.

The present invention, as would be known to one of ordinary skill in the art could be produced in hardware or software, or in a combination of hardware and software. The system, or method, according to the inventive principles as disclosed in connection with the preferred embodiment, may be produced in a single computer system having separate elements or means for performing the individual functions or steps described or claimed or one or more elements or means combining the performance of any of the functions or steps disclosed or claimed.

The invention is not limited to any particular computer program or logic or language, or instruction but may be practiced with any such suitable program, logic or language, or instructions as would be known to one of ordinary skill in the art.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. A receiver comprising:
    an intermediate to base band converter including:
        a first delta sigma sampler for receiving a first intermediate frequency signal, and in response thereto outputting a first sequence of samples at a first rate, wherein the first delta sigma sampler is characterized by a low pass transfer function;
        a first decimator coupled to the first delta sigma sampler for receiving the first series of samples at the first rate and outputting a second series of samples at a second rate that is less than the first rate;
        a first digital mixer coupled to the first decimator for receiving the second series of samples and multiplying successive subsets of the second series of samples by a first set of function values and outputting a first series of products;
        a second decimator coupled to the first digital mixer for receiving a third series of samples derived from the first series of products, and outputting a fourth series of samples at a third rate that is less than the second rate; and
    a radio frequency to intermediate frequency demodulator for receiving a radio frequency signal that includes a base band signal that is characterized by a bandwidth, and outputting an intermediate frequency signal that is characterized by an intermediate frequency that is less than about four times the bandwidth.

2. The receiver according to claim 1 wherein:
    the first delta sigma sampler comprises:
        one or more low pass filters each of which consists of continuous time circuitry.

3. The receiver according to claim 1 wherein the first decimator is characterized by:
    a Sinc function raised to an integer power frequency response.

4. The receiver according to claim 1 wherein the first digital mixer comprises:
    a canonic signed digit multiplier circuit.

5. The receiver according to claim 1 wherein the second decimator comprises:
    one or more canonic signed digit multipliers.

6. The receiver according to claim 1 wherein the second decimator comprises:
    a filter characterized by a impulse response shape that approximates a shape of a base band signal that is embedded in the first series of samples.

7. The receiver according to claim 6, wherein:

the second rate is between about 10 and 30 times a Nyquist rate of the base band signal.

8. The receiver according to claim 1 wherein:

the intermediate to base band converter further comprises:
- a second digital mixer coupled to the first decimator for receiving the second series of samples and multiplying successive subsets of the second series of samples by a second set of function values and outputting a second series of products,
- a second delta sigma sampler for receiving a second intermediate frequency signal component characterized by the intermediate frequency, and in response thereto outputting a fifth series of samples, wherein the second delta sigma sampler is characterized by the low pass transfer function;
- a third decimator coupled to the second delta sigma sampler for receiving the fifth series of samples at the first rate and outputting a sixth series of samples at the second rate;
- a third digital mixer coupled to the third decimator for receiving the sixth series of samples and multiplying successive subsets of the sixth series of samples by the second set of function values and outputting a third series of products;
- a fourth digital mixer coupled to the third decimator for receiving the sixth series of samples and multiplying successive subsets of the sixth series of samples by the first set of function values and outputting a fourth series of products;
- a first summer for subtracting the first series of products from the second series of products, the first summer including:
  - a first non inverting input coupled to the first digital mixer for receiving the first series of products;
  - an first inverting input coupled to the third digital mixer for receiving the third series of products; and
  - a first summer output coupled to the second decimator for outputting the third series of samples;
- a second summer for summing the second series of products and the fourth series of products, the second summer including:
  - a second non inverting input coupled to the second digital mixer for receiving the second series of products;
  - a third non inverting input coupled to the fourth digital mixer for receiving the fourth series of products; and
  - a second summer output for outputting a sequence of sums;
- a fourth decimator coupled to the second summer output for receiving the sequence of sums and outputting a seventh series of samples.

9. The receiver according to claim 8 wherein:

the second decimator comprises:
- a first filter characterized by a impulse response shape that approximates a shape of a base band signal that is embedded in the first series of samples;

the fourth decimator comprises:
- a second filter characterized by a impulse response shape that approximates a shape of a base band signal that is embedded in the fifth series of samples.

10. The receiver according to claim 9 wherein:

the second rate is between about 10 and 30 times a Nyquist rate of the base band signal.

11. The receiver according to claim 8 wherein:

the first set of function values approximate at least a portion of a cycle of a sinusoidal function; and the second set of function values is a circularly shifted version of the first set of function values.

12. A method of demodulating a signal comprising the steps of:

sampling a first signal with a sampler that is characterized by a low pass transfer function to obtain a first series of samples consisting of single bit words characterized by a first sample rate that is substantially higher than a Nyquist rate of the signal;

decimating and filtering the first series of samples to obtain a second series of samples consisting of multi bit words characterized by a second sample rate that is substantially higher than the Nyquist rate of the signal; and digitally mixing the second series of samples with a digital representation of a local oscillator signal at a first phase to obtain a third series of samples;

deriving a fourth series of samples from, at least, the third series of samples; and decimating and filtering the fourth series of samples to obtain a fifth series of samples that is characterized by a third sample rate that is about equal to the Nyquist rate.

13. The method of demodulating a signal according to claim 12 wherein the step of decimating and filtering the fourth series of samples comprises the step of:

applying a finite impulse response filter that is characterized by an impulse response that approximately matches a pulse shape of the first signal to the fourth series of samples.

14. The method of demodulating a signal according to claim 13 wherein:

the first signal is a first signal component of a received signal; and the method further comprises the steps of:
- sampling a second signal component of the received signal with a sampler that is characterized by a low pass transfer function to obtain a sixth series of samples that is characterized by a sample rate that is substantially higher than the Nyquist rate;
- decimating and filtering the sixth series of samples to obtain a seventh series of samples that is characterized by a sample rate that is substantially higher than the Nyquist rate;
- digitally mixing the seventh series of samples with the digital representation of the local oscillator signal at the first phase to obtain an eighth series of samples;
- digitally mixing the seventh series of samples with a digital representation of the local oscillator at a second phase to obtain a ninth series of samples;
- digitally mixing the second series of samples with a digital representation of a local oscillator signal at the second phase to obtain a tenth series of samples;
- sample-by-sample subtracting the ninth series of samples from the third series of samples to obtain the fourth series of samples;
- sample-by-sample summing the eighth series of samples and the tenth series of samples to obtain an eleventh series of samples; and
- decimating and filtering the eleventh series of samples to obtain an twelfth series of samples that is characterized by a rate that is about equal to the Nyquist rate.

15. A computer readable medium containing programming instructions for processing samples output of by one or more delta sigma samplers, including programming instructions for:

- decimating and low pass filtering a first series of samples that is output by a first delta sigma sampler to obtain a second series of samples that is characterized by a second sample rate that is substantially higher than a Nyquist rate of the signal;
- digitally mixing the second series of samples with a digital representation of a local oscillator signal at a first phase to obtain a third series of samples;
- deriving a fourth series of samples from, at least, the third series of samples; and
- decimating and filtering the fourth series of samples by applying a finite impulse response filter that is characterized by an impulse response that approximately matches a pulse shape of the first signal to the fourth series of samples thereby obtaining a fifth series of samples that is characterized by a third sample rate that is about equal to the Nyquist rate.

16. The computer readable medium according to claim 15 wherein the computer readable medium further comprises programming instructions for:

- decimating and low pass filtering a sixth series of samples that is output by a second delta sigma sampler to obtain a seventh series of samples that is characterized by a sample rate that is substantially higher than the Nyquist rate;
- digitally mixing the seventh series of samples with the digital representation of the local oscillator signal at the first phase to obtain an eighth series of samples;
- digitally mixing the seventh series of samples with a digital representation of the local oscillator at a second phase to obtain a ninth series of samples;
- digitally mixing the second series of samples with a digital representation of a local oscillator signal at the second phase to obtain a tenth series of samples;
- sample-by-sample subtracting the ninth series of samples from the third series of samples to obtain the fourth series of samples;
- sample-by-sample summing the eighth series of samples and the tenth series of samples to obtain an eleventh series of samples; and
- decimating and filtering the eleventh series of samples to obtain an twelfth series of samples that is characterized by a rate that is about equal to the Nyquist rate.

* * * * *

UNITED STATES PATENT AND TRADEMARK OFFICE
CERTIFICATE OF CORRECTION

PATENT NO. : 6,690,748 B2
DATED : February 10, 2004
INVENTOR(S) : Frederick L. Martin It is certified that error appears in the above-identified patent and that said Letters Patent is hereby corrected as shown below:

<u>Title page,</u>
Item [75], Inventors, change "Frederick J. Martin" to -- Frederick L. Martin --

Signed and Sealed this

Third Day of May, 2005

JON W. DUDAS
*Director of the United States Patent and Trademark Office*